(12) United States Patent
Matsumoto et al.

(10) Patent No.: US 10,109,580 B2
(45) Date of Patent: Oct. 23, 2018

(54) WIRING BOARD AND SEMICONDUCTOR DEVICE

(71) Applicant: SHINKO ELECTRIC INDUSTRIES CO., LTD., Nagano (JP)

(72) Inventors: Shunichiro Matsumoto, Nagano (JP); Hitoshi Kondo, Nagano (JP); Katsuya Fukase, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 15/367,264

(22) Filed: Dec. 2, 2016

(65) Prior Publication Data

US 2017/0179022 A1 Jun. 22, 2017

(30) Foreign Application Priority Data

Dec. 16, 2015 (JP) .................. 2015-244936

(51) Int. Cl.
*H01L 21/56* (2006.01)
*H01L 23/528* (2006.01)
(Continued)

(52) U.S. Cl.
CPC .......... *H01L 23/528* (2013.01); *H01L 21/563* (2013.01); *H01L 23/49827* (2013.01); *H01L 23/49838* (2013.01); *H01L 23/53228* (2013.01); *H01L 24/13* (2013.01); *H01L 24/16* (2013.01); *H01L 24/32* (2013.01); *H01L 24/73* (2013.01); *H01L 24/81* (2013.01); *H01L 24/83* (2013.01); *H01L 24/92* (2013.01); *H01L 23/3128* (2013.01); *H01L 23/49816* (2013.01); *H01L 2224/10175* (2013.01); *H01L 2224/133* (2013.01); *H01L 2224/13116* (2013.01); *H01L 2224/13144* (2013.01); *H01L 2224/13147* (2013.01); *H01L 2224/13294* (2013.01); *H01L 2224/13644* (2013.01); *H01L 2224/13647* (2013.01); *H01L 2224/16227* (2013.01); *H01L 2224/16237* (2013.01); *H01L 2224/32225* (2013.01); *H01L 2224/73204* (2013.01); *H01L 2224/81005* (2013.01); *H01L 2224/81022* (2013.01); *H01L 2224/81447* (2013.01); *H01L 2224/81815* (2013.01);
(Continued)

(58) Field of Classification Search
CPC ................. H01L 21/563; H01L 23/528; H01L 23/53228; H01L 24/13
See application file for complete search history.

(56) References Cited

U.S. PATENT DOCUMENTS 8,487,192 B2 7/2013 Kunieda et al.
8,766,463 B2 7/2014 Sun
(Continued)

FOREIGN PATENT DOCUMENTS

JP 2011-124555 6/2011

*Primary Examiner* — Joseph Galvin, III
(74) *Attorney, Agent, or Firm* — IPUSA, PLLC

(57) ABSTRACT

A wiring board includes a single-layer insulating layer, and a single-layer interconnect layer embedded in the insulating layer, wherein an entirety of a first surface of the interconnect layer is exposed in a recessed position relative to a first surface of the insulating layer, and a second surface of the interconnect layer is partially exposed in a recessed position relative to a second surface of the insulating layer.

7 Claims, 7 Drawing Sheets

(51) Int. Cl.
*H01L 23/532* (2006.01)
*H01L 23/00* (2006.01)
H01L 23/31 (2006.01)
H01L 23/498 (2006.01)

(52) U.S. Cl.
CPC ........... *H01L 2224/83005* (2013.01); *H01L 2224/83102* (2013.01); *H01L 2224/83385* (2013.01); *H01L 2224/92125* (2013.01); *H01L 2924/15311* (2013.01)

(56) References Cited

U.S. PATENT DOCUMENTS

2012/0217290 A1* 8/2012 Lee .................... B23K 35/3601
228/224
2012/0228012 A1* 9/2012 Yoshikawa ............ H05K 1/188
174/257
2017/0040249 A1* 2/2017 Yanagisawa ........ H01L 21/4853

* cited by examiner

WIRING BOARD AND SEMICONDUCTOR DEVICE

CROSS-REFERENCE TO RELATED APPLICATIONS

The present application is based upon and claims the benefit of priority from the prior Japanese Patent Application No. 2015-244936 filed on Dec. 16, 2015, with the Japanese Patent Office, the entire contents of which are incorporated herein by reference.

FIELD

The disclosures herein relate to a wiring board and a semiconductor device.

BACKGROUND

Semiconductor devices in which a semiconductor chip is flip-chip mounted on a wiring board having an interconnect layer and an insulating layer are known in the art. In such a structure, part of the interconnect layer serves as pads, which are soldered to the electrodes of the semiconductor chip. In some cases, a metal film or the like may be formed on the surface of the pads (see Patent Document 1, for example).

In the related-art wiring boards, the surface of an interconnect layer serving as pads and/or the surface of a metal film or the like formed on the pads is exposed at the same plane as (i.e., flush with) the surface of the insulating layer. Because of this, mounting a semiconductor chip on a wiring board may cause solder to flow out onto the insulating layer, resulting in a formation of a solder bridge between adjacent pads to create short-circuiting. This problem becomes more prominent as the interval between adjacent pads narrows, thereby lowering the reliability of insulation between pads.
[Patent Document 1] Japanese Patent No. 5003812

SUMMARY

According to an aspect of the embodiment, a wiring board includes a single-layer insulating layer, and a single-layer interconnect layer embedded in the insulating layer, wherein an entirety of a first surface of the interconnect layer is exposed in a recessed position relative to a first surface of the insulating layer, and a second surface of the interconnect layer is partially exposed in a recessed position relative to a second surface of the insulating layer.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described by referring to the accompanying drawings. In these drawings, the same elements are referred to by the same references, and a duplicate description thereof may be omitted.

First Embodiment

Structure of Semiconductor Device of First Embodiment

Figure 1A:
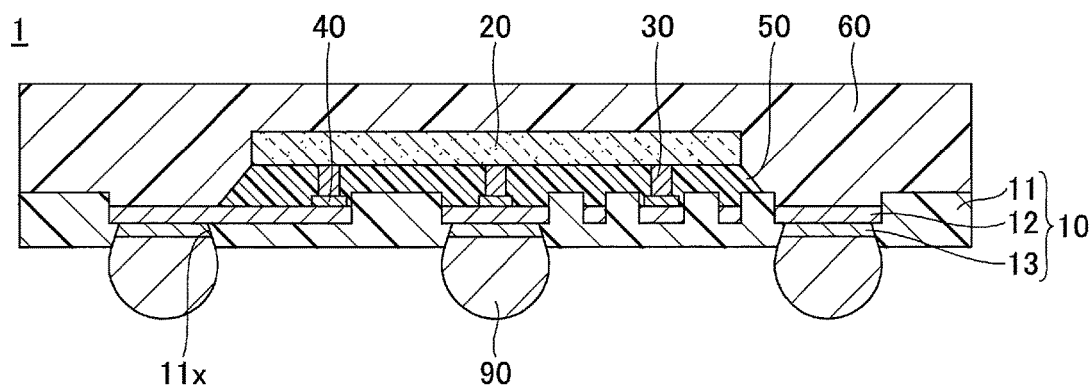
FIGS. 1A and 1B are drawings illustrating an example of a semiconductor device according to a first embodiment.
Figure 1B:
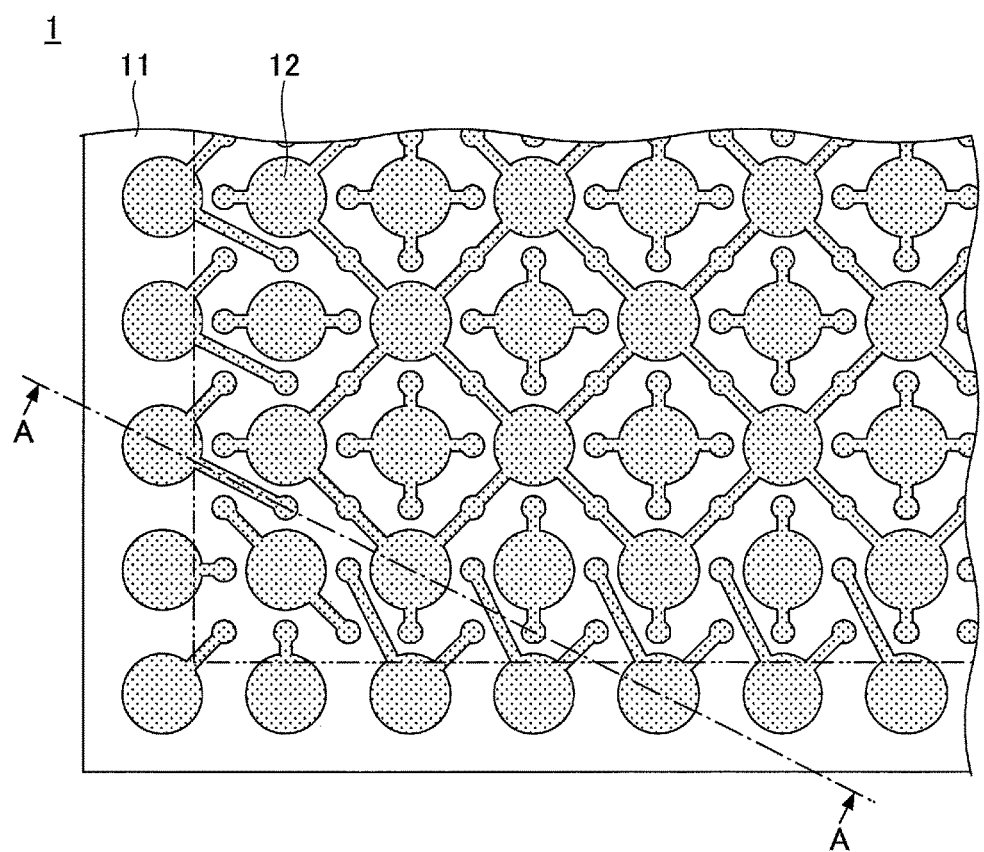

In the following, a description will be first given of the structure of a semiconductor device of a first embodiment. FIGS. 1A and 1B are drawings illustrating an example of the semiconductor device according to the first embodiment. FIG. 1A illustrates a cross-sectional view, and FIG. 1B illustrates an enlarged plan view of an insulating layer 11 and an interconnect layer 12 illustrated in FIG. 1A. FIG. 1A depicts a cross-section taken along the line A-A in FIG. 1B. In FIG. 1B, the interconnect layer 12 is shown in dot shading for the sake of clarity.

In FIG. 1A, a semiconductor device 1 of the first embodiment includes a wiring board 10, a semiconductor chip 20, bumps 30, solder 40, underfill resin 50, and mold resin 60. The wiring board 10 includes the insulating layer 11, the interconnect layer 12, and a surface treatment film 13.

In the present embodiment, for the sake of convenience, the side of the semiconductor device 1 on which the mold resin 60 is situated is referred to as an upper side or a first side, and the side on which the insulating layer 11 is situated is referred to as a lower side or a second side. A surface (or face) of a given member that faces toward the upper side is referred to as a first surface (or first face) or an upper surface (or upper face), and a surface (or face) of the given member that faces toward the lower side is referred to as a second surface (or second face) or a lower surface (or lower face). It may be noted, however, that the semiconductor device 1 may be used in an upside-down position, or may be placed at any angle. Further, a plan view refers to a view taken in the direction perpendicular to the first surface of the insulating layer 11, and a planar shape refers to the shape of an object as viewed in the direction perpendicular to the first surface of the insulating layer 11.

The wiring board 10 includes a single-layer insulating layer (i.e., the insulating layer 11) and a single-layer interconnect layer (i.e., the interconnect layer 12). This structure enables thickness reduction of the wiring board 10.

The insulating layer 11 may be made of insulating resin such as epoxy resin, imide resin, phenol resin, cyanate resin, or the like. Insulating resin constituting the insulating layer 11 may be thermosetting resin or thermoplastic resin. The insulating layer 11 may include a reinforcement member. The reinforcement member may a woven cloth or unwoven cloth made of glass fiber, carbon fiber, aramid fiber, or the like. The insulating layer 11 may include filler such as silica (SiO2). The thickness of the insulating layer 11 may be about 10 to 100 micrometers, for example.

The interconnect layer 12 is embedded in the insulating layer 11. The side faces and lower face of the interconnect layer 12 are covered with the insulating layer 11, and the entire upper face of the interconnect layer 12 is exposed in a recessed position relative to (i.e., below) the upper surface of the insulating layer 11. In other words, the upper surface of the interconnect layer 12 and the upper surface of the insulating layer 11 are not flush with each other and form a step. The size of a recess (i.e., the size of a step) formed by the upper surface of the interconnect layer 12 relative to the upper surface of the insulating layer 11 may be about 2 to 10 micrometers, for example. Cu may be used as the material of the interconnect layer 12. The thickness of the interconnect layer 12 may be about 5 to 50 micrometers, for example. The inner wall faces of the insulating layer 11 forming the steps are substantially vertical without tapering, and are substantially perpendicular to the upper surface of the interconnect layer 12.

The lower face of the insulating layer 11 has openings 11x formed therein. The openings 11x selectively exposes part of the lower surface of the interconnect layer 12. The lower surface of the interconnect layer 12 is partially exposed in a recessed position relative to the lower surface of the insulating layer 11. The lower surface of the interconnect layer 12 exposed through the openings 11x has the surface treatment film 13 formed thereon. Examples of the surface treatment film 13 include metal films such as an Au film, an Ni/Au film (i.e., a metal film in which an Ni film and an Au film are laminated one over another in this order), an Ni/Pd/Au film (i.e., a metal film in which an Ni film, a Pd film, and an Au film are laminated one over another in this order), an Ni/Pd film (i.e., a metal film in which an Ni film and a Pd film are laminated one over another in this order), an Ag film, and a solder plating film. Another example of the surface treatment film 13 is an anti-oxidation film that is formed by an OSP (organic solderability preservative) process or the like. An anti-oxidation film formed by the OSP process is an organic coating film made of azole compound, imidazole compound, or the like.

A lower face of the surface treatment film 13 may have a solder bump 90 formed thereon as an external connection terminal. An alloy including Pb, an alloy of Sn and Cu, an alloy of Sn and Ag, or an alloy of Sn, Ag, and Cu may be used as a material to form the solder bump 90. It may be noted that the formation of the solder bump 90 is not essential, and that the solder bump 90 may be formed according to need.

The semiconductor chip 20 is flip-chip mounted on the wiring board 10 on the upper face side of the insulating layer 11. Specifically, the semiconductor chip 20 has the bumps 30 such as gold bumps or copper bumps formed thereon, which are connected to the upper surface of the interconnect layer 12 of the wiring board 10 with the solder 40. In other words, the areas of the upper surface of the interconnect layer 12 that have the solder 40 formed thereon serve as connection pads for connection with the semiconductor chip 20. An alloy including Pb, an alloy of Sn and Cu, an alloy of Sn and Ag, or an alloy of Sn, Ag, and Cu may be used as a material to form the solder 40.

In this manner, the wiring board 10 has the upper face of the interconnect layer 12 serving as an electronic component mounting face and has the lower face of the interconnect layer 12 serving as an external-connection-terminal mounting face.

The underfill resin 50 fills the gap between the semiconductor chip 20 and the upper surface of the wiring board 10. The underfill resin 50 may be made of an epoxy-based resin or the like that has sufficient fluidity. The mold resin 60 is formed on the wiring board 10 to serve as encapsulation resin to encapsulate the semiconductor chip 20, the underfill resin 50, and the upper surface of the wiring board 10. The mold resin 60 may be made of an epoxy-based resin or the like that has sufficient stiffness. The fluidity and stiffness of the epoxy-based resin may be controlled by adjusting the composition of resin, the type and amount of contained filler, etc. It may be noted that only the mold resin 60 may be provided without the provision of the underfill resin 50.

Method of Making Semiconductor Device of First Embodiment

In the following, a description will be given of a method of making a semiconductor device according to the first embodiment. FIGS. 2A through 2C through FIGS. 6A to 6C are drawings illustrating examples of process steps for making a semiconductor device according to the first embodiment.

Figure 2A:
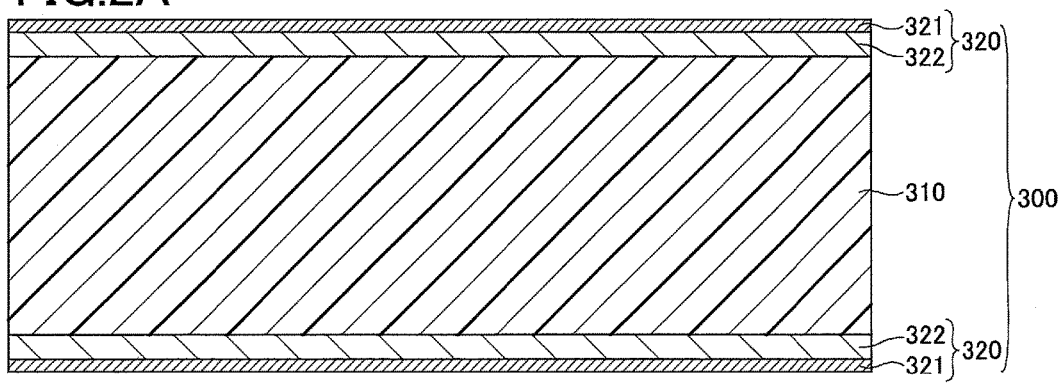
FIGS. 2A through 2C are drawings illustrating an example of process steps for making the semiconductor device according to the first embodiment.

In the process step illustrated in FIG. 2A, a support body 300 having a flat upper surface is provided. The support body 300 may be a prepreg 310 each surface of which has a metal foil 320 with a carrier laminated thereon, for example. The thickness of the support body 300 may be about 50 to 500 μm, for example.

The prepreg 310 is a woven cloth or unwoven cloth (not shown) of glass fiber, aramid fiber, or the like impregnated with insulating resin such as epoxy-based resin. The metal foil 320 with a carrier includes a thick copper foil (i.e., carrier foil) 322 having a thickness of approximately 10 to 50 micrometers and a thin copper foil 321 having a thickness of approximately 1.5 to 5 micrometers, which is attached to the thick foil 322 via a strip layer (not shown) in a strippable manner. The thick foil 322 serves as a support body for providing ease of handling the thin foil 321. The thick foil 322 is bounded to the prepreg 310.

Figure 2B:
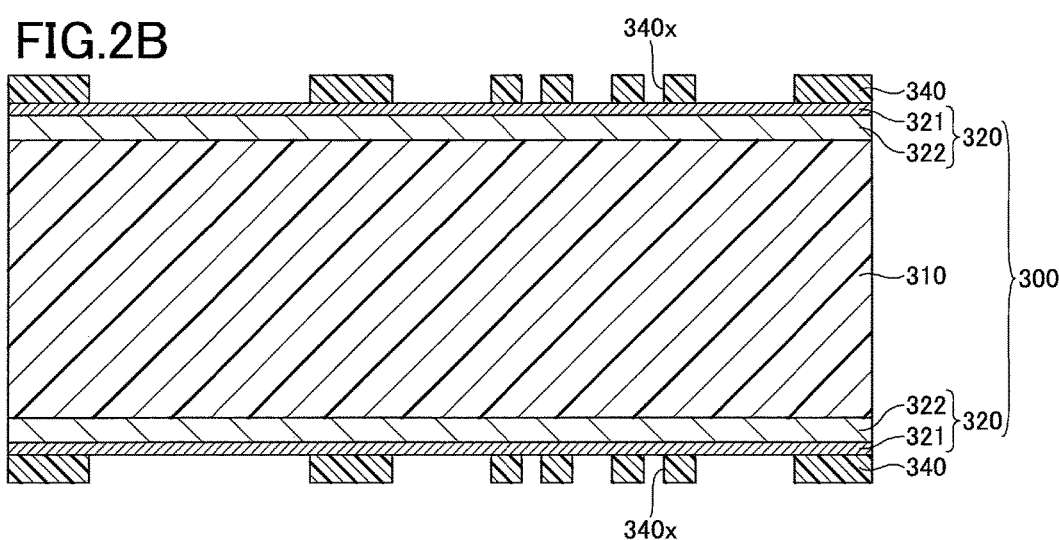

In the process step illustrated in FIG. 2B, resist layers 340 each having openings 340x at the positions of the interconnect layer 12 to be formed are formed on both of the thin foils 321. Specifically, dry-film resist made of photosensitive resin may be laminated as the resist layers 340 on both of the thin foils 321, for example. Patterning is then performed by exposure and development with respect to the dry-film resist, thereby forming the openings 340x that expose the thin foil 321 at the positions of the interconnect layer 12 to be formed.

Figure 2C:
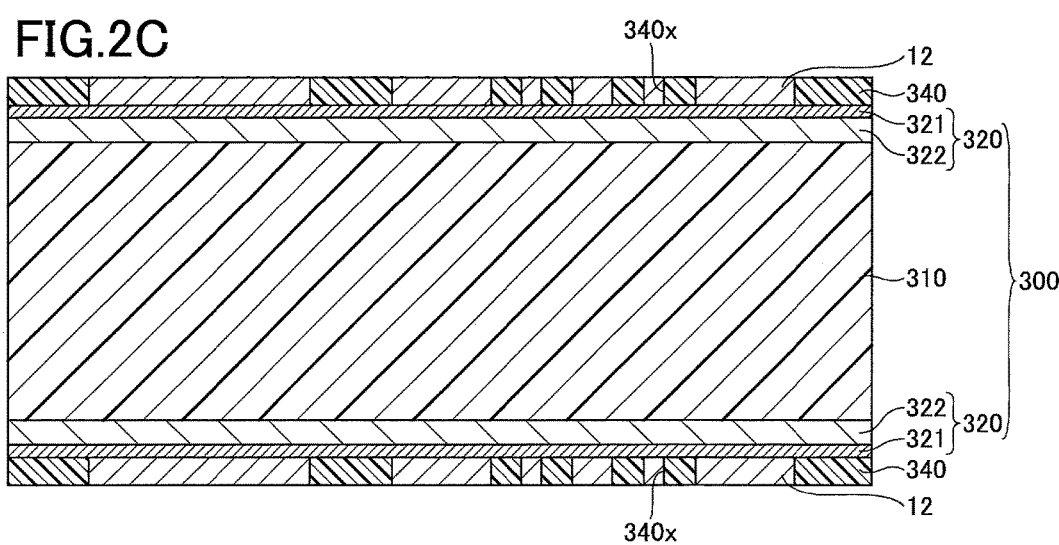

In the process step illustrated in FIG. 2C, the electrolytic plating method utilizing the metal foil 320 with a carrier as a plating power feeding layer may form the interconnect layer 12 on the portions of the thin foil 321 exposed through the openings 340x of the resist layer 340.

Figure 3A:
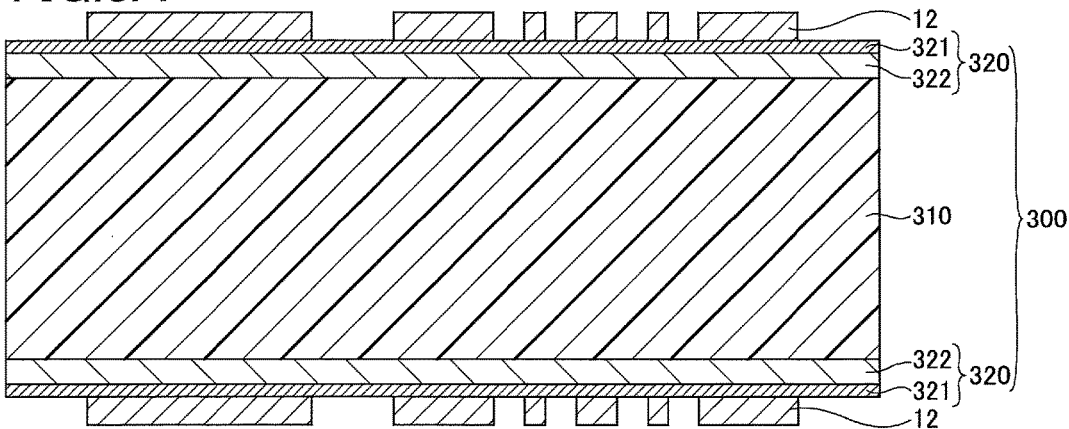
FIGS. 3A through 3C are drawings illustrating an example of process steps for making the semiconductor device according to the first embodiment.

In the process step illustrated in FIG. 3A, the resist layers 340 illustrated in FIG. 2C is removed. The resist layers 340 may be removed by use of a stripping solution containing sodium hydroxide or the like, for example.

Figure 3B:
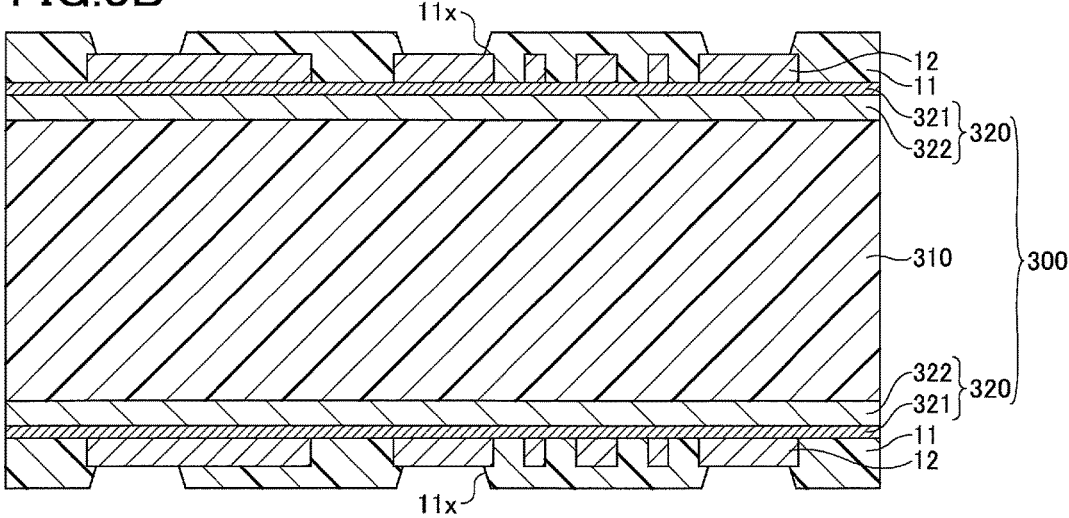

In the process step illustrated in FIG. 3B, the insulating layers 11 each having the openings 11x that selectively expose the interconnect layer 12 are formed on both of the thin foils 321. Specifically, insulating resin such as an epoxy-based-resin film having thermosetting property may be laminated on both of the thin foils 321 to cover the interconnect layers 12, for example. Alternatively, insulating resin such as epoxy-based-resin liquid or paste having thermosetting property may be applied to both of the thin foils 321 by a screen printing method, a spin coating method, or the like to cover the interconnect layers 12, for example. The laminated or applied insulating resin is then heated, for curing, to higher than the thermosetting temperature to form the insulating layers 11. Pressure may also be applied while heating, if necessary.

In the case of photosensitive resin being used as the insulating layer 11, the openings 11x may be formed in the insulating layer 11 by exposure and development (i.e., by a photolithography method). In the case of non-photosensitive insulating resin being used as the insulating layer 11, the openings 11x may be formed by a laser process, a blast process, or the like.

The surface of the interconnect layer 12 may be roughened by a known method prior to the forming of the insulating layer 11, thereby improving adhesion with the insulating layer 11.

Figure 3C:
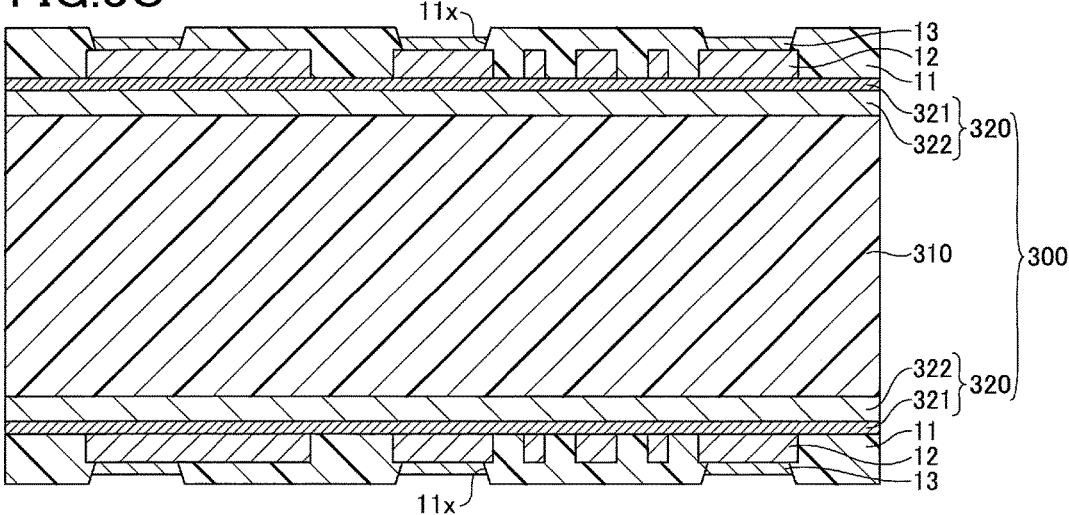

In the process step illustrated in FIG. 3C, a non-electrolytic plating method or the like forms the surface treatment film 13 on the interconnect layer 12 that is exposed at the bottom of the openings 11x. The surface treatment film 13 may be the metal film as was previously described, for example. The surface treatment film 13 may be an antioxidation film (organic coating film) formed by an OSP process or the like.

Figure 4A:
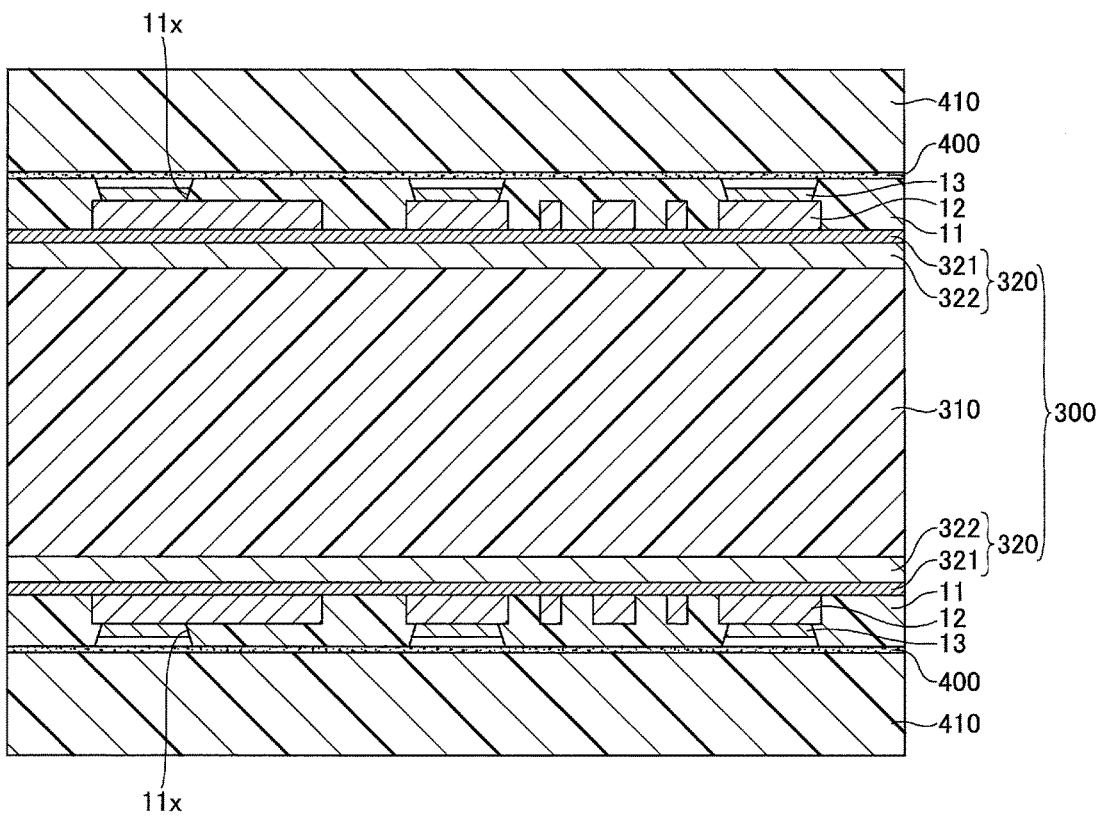
FIGS. 4A through 4C are drawings illustrating an example of process steps for making the semiconductor device according to the first embodiment.

In the process step illustrated in FIG. 4A, a second support body 410 is formed on each of the insulating layers 11 with a removable adhesive layer 400 intervening therebetween. The adhesive layer 400 and the second support body 410 are preferably made of materials selected to have chemical resistance against the process step for etching and removing the thin foil 321 and selected to have heat resistance against the head load imposed in the step for mounting the semiconductor chip 20 and in the steps subsequent thereto. Epoxy-based adhesive may be used as the adhesive layer 400, for example. A polyimide film, metal foil, ceramic board, resin board, or the like may be used as the second support body 410.

Figure 4B:
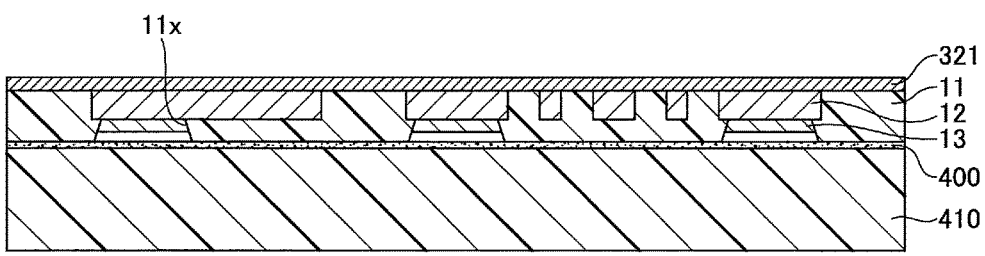

In the process step illustrated in FIG. 4B, part of the support body 300 is removed. Specifically, a mechanical force is applied to the support body 300 to strip the thin foil 321 from the thick foil 322 at the interface therebetween with respect to each metal foil 320. As was previously described, the structure of the metal foil 320 with a carrier is such that the thin foil 321 is attached to the thick foil 322 via a strip layer (not shown), thereby allowing the thick foil 322 together with the strip layer to be easily removed from the thin foil 321.

In this manner, only the thin foil 321 remains with the insulating layer 11, with the other members (i.e., the prepreg 310 and the thick foil 322) of the support body 300 being removed. It may be noted that although FIG. 4B illustrates only a single laminated structure obtained after the removal of part of the support body 300, the removal process also produces one more laminated structure having the same or similar construction. In the following drawings, only one laminated structure will be illustrated and described.

Figure 4C:
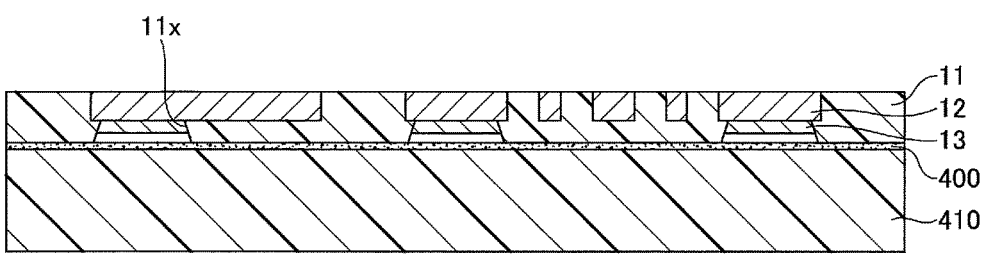

In the process step illustrated in FIG. 4C, the thin foil 321 (see FIG. 4B) made of copper is removed by etching. The thin foil 321 made of copper may be removed by wet etching utilizing hydrogen peroxide/sulfuric-acid solution, sodium persulfate solution, ammonium persulfate solution, or the like.

Figure 5A:
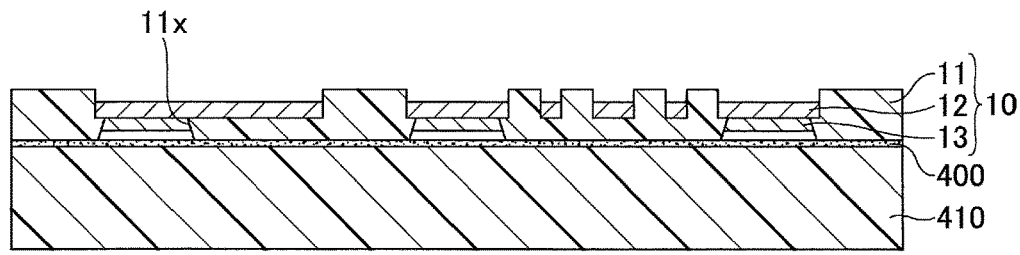
FIGS. 5A through 5C are drawings illustrating an example of process steps for making the semiconductor device according to the first embodiment.

In the process step illustrated in FIG. 5A, the upper surface of the interconnect layer 12 is etched. This process causes the upper surface of the interconnect layer 12 to be retracted from the upper surface of the insulating layer 11, so that a step is formed between the upper surface of the interconnect layer 12 and the upper surface of the insulating layer 11. The size of a recess (i.e., the size of a step) formed by the upper surface of the interconnect layer 12 relative to the upper surface of the insulating layer 11 may be about 2 to 10 micrometers, for example. In the case of the interconnect layer 12 being made of copper, the etching solution used in the process step illustrated in FIG. 4C may be used.

After etching the upper surface of the interconnect layer 12, the upper surface of the interconnect layer 12 is cleaned by a plasma process or the like. With this arrangement, copper oxide that may be formed by oxidation of the upper surface of the interconnect layer 12 made of copper is reduced, and/or an organic film made of oil or the like is removed. As a result, a cleaned copper surface is exposed in a recessed position relative of the insulating layer 11. With the processes described above, the wiring board 10 is obtained.

Figure 5B:
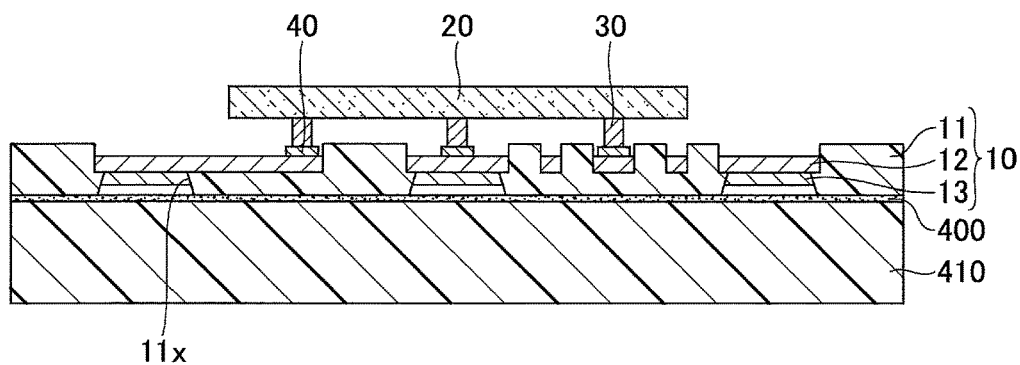

In the process step illustrated in FIG. 5B, the semiconductor chip 20 is flip-chip mounted on the wiring board 10. Specifically, cream solder or the like is applied to selective areas on the upper surface of the interconnect layer 12, followed by placing the semiconductor chip 20 on the wiring board 10 such that the bumps 30 are positioned on the cream solder or the like. Reflow or the like is then performed to melt and solidify the cream solder or the like to form the solder 40. With this arrangement, the bumps 30 are connected to the upper surface of the interconnect layer 12, so that the semiconductor chip 20 is flip-chip mounted on the wiring board 10.

Since the upper surface of the insulating layer 11 is higher than the upper surface of the interconnect layer 12, an excess portion of the cream solder upon being melted is prevented from flowing out from the upper surface of the interconnect layer 12 to the upper surface of the insulating layer 11. Because of this, narrowing the interval between the connection pads (i.e., the areas in which the solder 40 is formed on the upper surface of the interconnect layer 12) for connection with the semiconductor chip 20 does not cause a solder bridge to be formed between the adjacent solders 40, thereby improving the reliability of insulation between the pads. In particular, the inner wall surface of the insulating layer 11 forming the step is substantially perpendicular to the upper surface of the interconnect layer 12 without tapering, so that the inner wall surface effectively serves as a dam for preventing the melted cream solder or the like from flowing out to the upper surface of the insulating layer 11.

It may be noted that the related art may perform a process step of forming underfill resin before melting solder in order to prevent the solder from flowing out. In the semiconductor device 1, however, a measure as describe above is in place to prevent solder from flowing out. There is thus no need to adopt a process step of forming underfill resin before melting the solder.

Further, the upper surface of the interconnect layer 12 is cleaned by a plasma processing or the like in the process step illustrated in FIG. 5A, which enables the provision of sufficient solder wettability without the need for a surface treatment film (e.g., a metal film or an organic film) specifically formed on the upper surface of the interconnect layer 12. This improves the reliability of connection between the solder 40 and the upper surface of the interconnect layer 12.

Moreover, forming a surface treatment film on the upper surface of the interconnect layer 12 generally serves to lower adhesion to the underfill resin 50 and to the mold resin 60 because the degree of roughness of the upper surface of the surface treatment film is smaller (i.e., smoother) than the degree of roughness of the upper surface of the interconnect layer 12. The semiconductor device 1 does not have a surface treatment film formed on the upper surface of the interconnect layer 12, and thus retains good adhesion between the upper surface of the interconnect layer 12 and the underfill resin 50 or the mold resin 60.

Figure 5C:
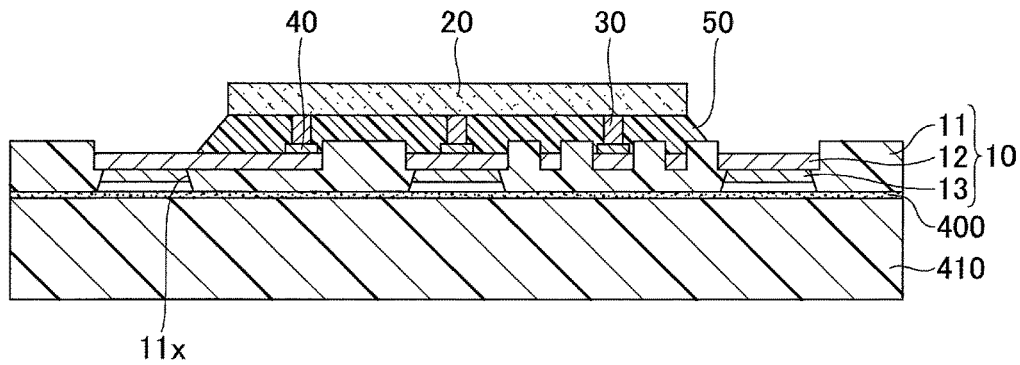
Figure 6A:
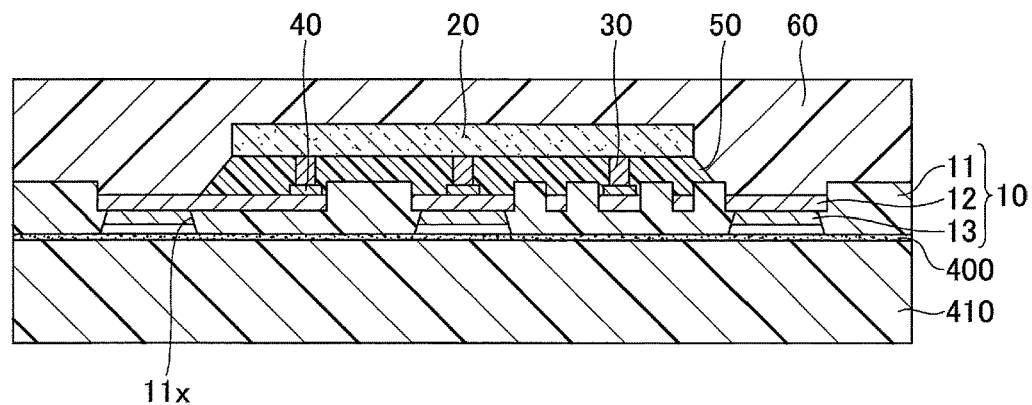
FIGS. 6A through 6C are drawings illustrating an example of process steps for making the semiconductor device according to the first embodiment.
Figure 6B:
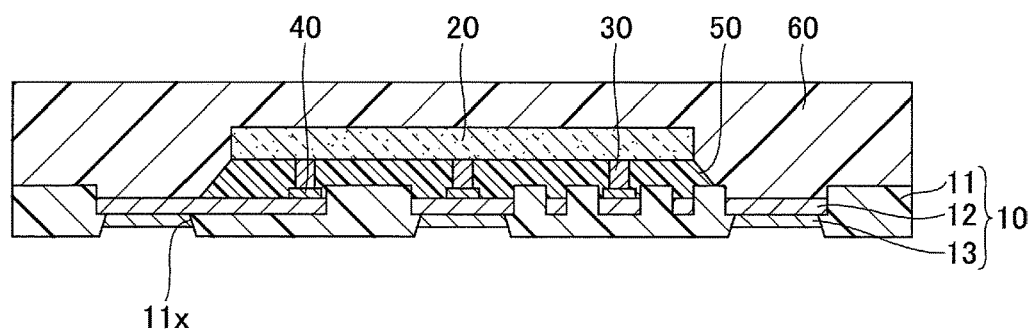
Figure 6C:
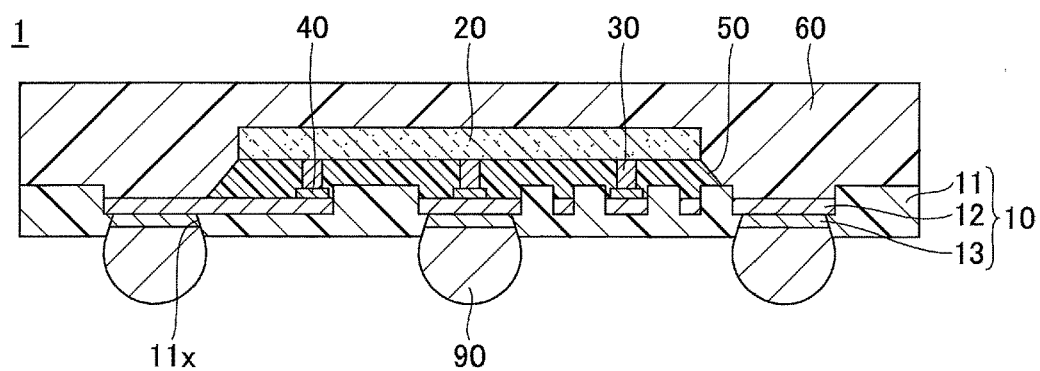

In the process step illustrated in FIG. 5C, the underfill resin 50 is formed between the semiconductor chip 20 and the wiring board 10. In the process step illustrated in FIG. 6A, the mold resin 60 is formed on the wiring board 10 to encapsulate the semiconductor chip 20 and the underfill resin 50. In the subsequent process step illustrated in FIG. 6B, the adhesive layer 400 and the second support body 410 are removed. In the process step illustrated in FIG. 6C, the solder bumps 90 are formed on the lower faces of the surface treatment film 13 according to need. Consequently, the semiconductor device 1 as illustrated in FIG. 1 is obtained. It may be noted that the process step illustrated in FIG. 5C may not be performed. In such a case, the underfill resin 50 is not formed, and only the mold resin 60 is formed.

As described above, the semiconductor device 1 has the upper surface of the insulating layer 11 positioned higher than the upper surface of the interconnect layer 12. At the time of mounting the semiconductor chip 20, thus, the solder material for connecting the wiring board 10 with the semiconductor chip 20 is prevented from flowing out to the upper surface of the insulating layer 11. Because of this, narrowing the interval between the connection pads (i.e., the areas in which the solder is formed on the upper surface of the interconnect layer 12) for connection with the semiconductor chip 20 does not cause a solder bridge to be formed between the adjacent solders 40, thereby improving the reliability of insulation between the pads.

First Variation of First Embodiment

The first variation of the first embodiment is directed to a case in which a surface treatment film is selectively formed on the upper surface of the interconnect layer 12 to intervene between the solder 40 and the interconnect layer 12. In connection with the first variation of the first embodiment, a description of the same or similar constituent elements as those of the previously provided descriptions may be omitted as appropriate.

Figure 7A:
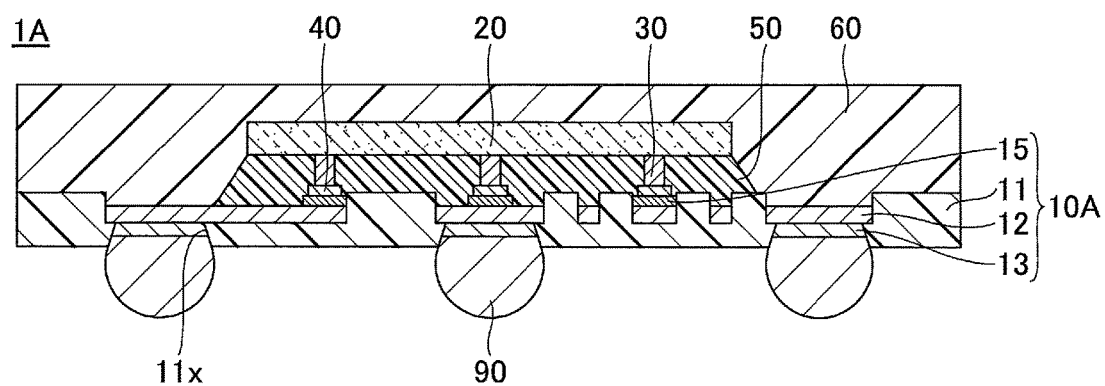
FIGS. 7A and 7B are drawings illustrating an example of a semiconductor device according to a first variation of the first embodiment.
Figure 7B:
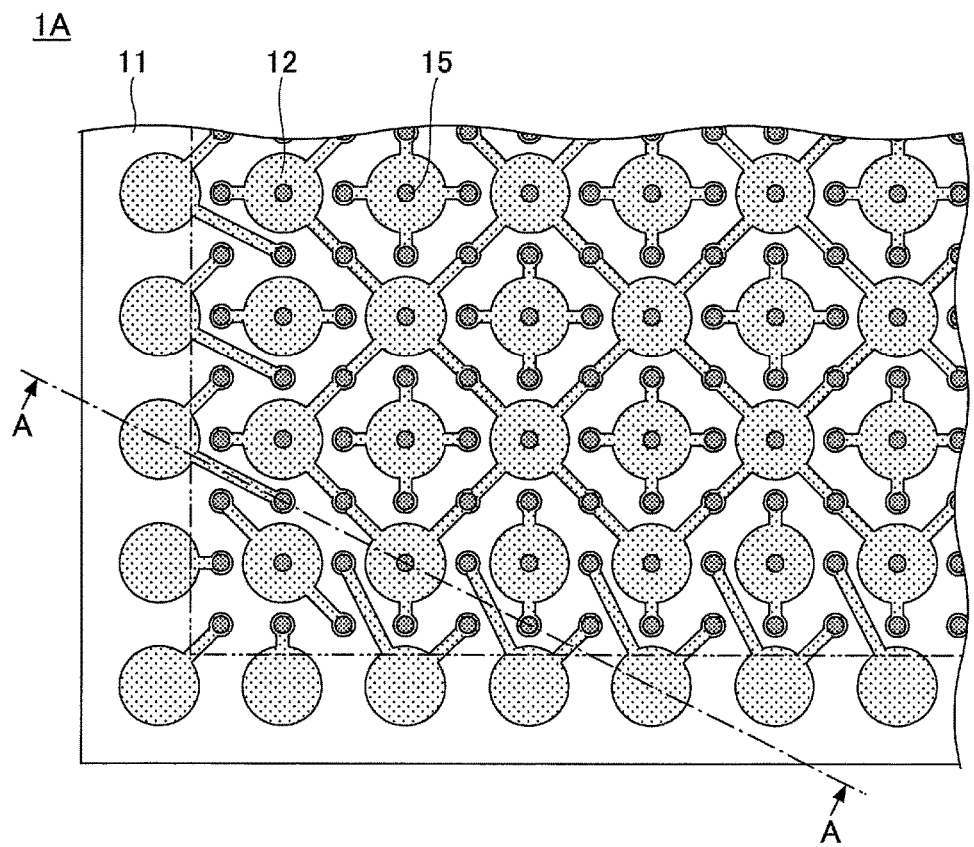

FIGS. 7A and 7B are drawings illustrating an example of the semiconductor device according to the first variation of the first embodiment. FIG. 7A illustrates a cross-sectional view, and FIG. 7B illustrates an enlarged plan view of an insulating layer 11 and an interconnect layer 12 illustrated in FIG. 7A. FIG. 7A depicts a cross-section taken along the line A-A in FIG. 7B. In FIG. 7B, the interconnect layer 12 and a surface treatment film are shown in dot shading for the sake of clarity.

With reference to FIGS. 7A and 7B, a semiconductor device 1A according to the first variation of the first embodiment differs from the semiconductor device 1 (see FIGS. 1A and 1B) in that a wiring board 10A has the interconnect layer 12 on the upper surface of which the surface treatment film 15 is selectively formed. The solder 40 is formed on the surface treatment film 15 to connect the bumps 30 of the semiconductor chip 20 to the surface treatment film 15. The surface treatment film 15 may be implemented by use of a metal film or anti-oxidation film (e.g., organic coating film) the same as or similar to the surface treatment film 13, for example.

As described above, the surface treatment film 15 may selectively be formed on the upper surface of the interconnect layer 12. In such a case also, the upper surface of the insulating layer 11 is situated higher than the upper surface of the interconnect layer 12, so that an excess portion of the solder cream or the like upon being melted is guided to flow, from the upper surface of the surface treatment film 15, only to such areas of the upper surface of the interconnect layer 12 as are not covered with the surface treatment film 15. With this arrangement, the excessive portion of the melted solder is prevented from flowing out to the upper surface of the insulating layer 11.

The semiconductor device 1A has the surface treatment film 15 that ensures the provision of sufficient solder wettability. There is thus no need for cleaning by a plasma processing or the like described in connection with the process step illustrated in FIG. 5A of the first embodiment.

Although the first variation of the first embodiment is directed to the example in which the surface treatment film 15 is selectively formed on the upper surface of the interconnect layer 12, the surface treatment film 15 may alternatively be formed over the entire upper surface of the interconnect layer 12. In such a case, the upper surface of the surface treatment film 15 is still preferably placed in a recessed position relative to the upper surface of the insulating layer 11. In other words, the upper surface of the surface treatment film 15 and the upper surface of the insulating layer 11 are preferably not flush with each other and form a step. This arrangement serves to provide the same or similar advantages as in the first embodiment.

Although a description has been given with respect to preferred embodiments and the like, the present invention is not limited to these embodiments and the like, but various variations and modifications may be made to these embodiments and the like without departing from the scope of the present invention.

For example, the interconnect layer 12 may be formed in a trapezoid shape or an upside-down trapezoid shape, thereby providing the inner wall surface of the insulating layer 11 that is tapered or inversely tapered.

Moreover, a semiconductor chip may be flip-chip mounted after the underfill resin is formed on the insulating layer 11 and the interconnect layer 12.

According to at least one embodiment, a wiring board improves the reliability of insulation between pads when a semiconductor chip is mounted.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A wiring board, comprising:
 a support body;
 a single-layer insulating layer; and
 a single-layer interconnect layer made of copper embedded in the insulating layer, wherein an entire first surface of the single-layer interconnect layer is situated in a recessed position relative to, and not covered with, a first surface of the single-layer insulating layer, the entire first surface of the single-layer interconnect layer being covered with neither the single-layer insulating layer nor another layer situated in a recessed position relative to the first surface of the single-layer insulating layer, and a portion of a second surface of the single-layer interconnect layer is partially situated in a recessed position relative to a second surface of the single-layer insulating layer, and wherein the support body is attached to the second surface of the single-layer insulating layer to cover a recessed space at the portion of the second surface of the single-layer interconnect layer.

2. The wiring board as claimed in claim 1, wherein the first surface of the single-layer interconnect layer is an electronic-component mounting surface, and the second surface of the single-layer interconnect layer is an external-connection-terminal mounting surface.

3. A semiconductor device, comprising:

a wiring board including a single-layer insulating layer and a single-layer interconnect layer made of copper embedded in the single-layer insulating layer; and a semiconductor chip mounted on a first surface side of the single-layer insulating layer, wherein an entire first surface of the single-layer interconnect layer is situated in a recessed position relative to, and not covered with, a first surface of the single-layer insulating layer, at least a portion of the entire first surface of the single-layer interconnect layer being covered with a solder, with no intervening layer being disposed between the solder and the first surface of the single-layer interconnect layer, and a portion of a second surface of the single-layer interconnect layer is partially situated in a recessed position relative to, and not covered with, a second surface of the single-layer insulating layer, and wherein the semiconductor chip is connected with solder to the first surface of the single-layer interconnect layer, the solder being in direct contact with the first surface of the single-layer interconnect layer.

4. The semiconductor device as claimed in claim 3, further comprising an encapsulating resin configured to cover the semiconductor chip and a first surface of the wiring board.

5. The semiconductor device as claimed in claim 3, further comprising underfill resin configured to fill a gap between the semiconductor chip and a first surface of the wiring board, the underfill resin being in direct contact with the single-layer interconnect layer.

6. A wiring board, comprising:

a single-layer insulating layer;

a single-layer interconnect layer made of copper embedded in the single-layer insulating layer; and a surface treatment film selectively formed on part of an entire first surface of the single-layer interconnect layer, wherein the entire first surface of the single-layer interconnect layer and the surface treatment film are situated in a recessed position relative to, and not covered with, a first surface of the single-layer insulating layer, and a portion of a second surface of the single-layer interconnect layer is partially situated in a recessed position relative to, and not covered with, a second surface of the single-layer insulating layer.

7. A semiconductor device, comprising:

a wiring board including a single-layer insulating layer, a single-layer interconnect layer made of copper embedded in the single-layer insulating layer, and a surface treatment film selectively formed on part of an entire first surface of the single-layer interconnect layer; and a semiconductor chip mounted on a first surface side of the single-layer insulating layer, wherein the entire first surface of the single-layer interconnect layer and the surface treatment film are situated in a recessed position relative to, and not covered with, a first surface of the single-layer insulating layer, and a portion of a second surface of the single-layer interconnect layer is partially situated in a recessed position relative to, and not covered with, a second surface of the single-layer insulating layer, and wherein the semiconductor chip is connected with solder to the first surface of the single-layer interconnect layer, the solder being in direct contact with the surface treatment film on the first surface of the single-layer interconnect layer and also in direct contact with the first surface of the single-layer interconnect layer, the surface treatment film intervening between the solder and the single-layer interconnect layer.

\* \* \* \* \*